(12) United States Patent
Shih et al.

(10) Patent No.: US 12,176,266 B2
(45) Date of Patent: Dec. 24, 2024

(54) THROUGH-SUBSTRATE VIA FORMATION TO ENLARGE ELECTROCHEMICAL PLATING WINDOW

(71) Applicant: Taiwan Semiconductor Manufacturing Company, Ltd., Hsinchu (TW)

(72) Inventors: Hung-Ling Shih, Tainan (TW); Ming Chyi Liu, Hsinchu (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 173 days.

(21) Appl. No.: 17/880,854

(22) Filed: Aug. 4, 2022

(65) Prior Publication Data
US 2022/0375828 A1   Nov. 24, 2022

Related U.S. Application Data

(62) Division of application No. 17/150,048, filed on Jan. 15, 2021, now Pat. No. 11,652,025.

(51) Int. Cl.
*H01L 23/48* (2006.01)
*H01L 21/768* (2006.01)
*H01L 27/146* (2006.01)

(52) U.S. Cl.
CPC ...... *H01L 23/481* (2013.01); *H01L 21/76831* (2013.01); *H01L 21/76832* (2013.01);
(Continued)

(58) Field of Classification Search
CPC ............. H01L 23/481; H01L 21/76898; H01L 21/31116; H01L 21/78; H01L 21/31144;
(Continued)

(56) References Cited

U.S. PATENT DOCUMENTS

| 7,582,971 B2 | 9/2009 | Kameyama et al. |
| 2006/0024966 A1 | 2/2006 | Umemoto et al. |

(Continued)

FOREIGN PATENT DOCUMENTS

| CN | 104617036 A | 5/2015 |
| TW | 201304057 A | 1/2013 |

OTHER PUBLICATIONS

Non-Final Office Action dated Sep. 1, 2022 for U.S. Appl. No. 17/150,048.

*Primary Examiner* — Jaehwan Oh
*Assistant Examiner* — John M Parker
(74) *Attorney, Agent, or Firm* — Eschweiler & Potashnik, LLC

(57) ABSTRACT

In some embodiments, the present disclosure relates to an integrated chip (IC). The IC includes a conductive structure disposed within a dielectric structure along a first side of a semiconductor substrate. An insulating structure is disposed along inner sidewalls of the semiconductor substrate. The inner sidewalls of the semiconductor substrate extend through the semiconductor substrate. A blocking layer is disposed along inner sidewalls of the insulating structure. A through-substrate via (TSV) includes a first portion and a second portion. The first portion extends from a second side of the semiconductor substrate to a horizontally-extending surface of the insulating structure that protrudes outward from the inner sidewalls of the insulating structure. The second portion extends from the first portion to the conductive structure and has a maximum width less than that of the first portion.

20 Claims, 10 Drawing Sheets

(52) U.S. Cl.
CPC .. *H01L 21/76898* (2013.01); *H01L 27/14636* (2013.01); *H01L 27/1464* (2013.01)

(58) Field of Classification Search
CPC ............. H01L 21/76831; H01L 21/486; H01L 21/76897; H01L 21/76832; H01L 25/0657
See application file for complete search history.

(56) References Cited

U.S. PATENT DOCUMENTS

| | | |
|---|---|---|
| 2009/0032951 A1 | 2/2009 | Andry et al. |
| 2010/0171223 A1 | 7/2010 | Kuo et al. |
| 2011/0155692 A1 | 6/2011 | Yau |
| 2012/0125879 A1 | 5/2012 | Park et al. |
| 2014/0246325 A1 | 9/2014 | Tsuchiya et al. |
| 2017/0154850 A1 | 6/2017 | Kao et al. |
| 2017/0200640 A1 | 7/2017 | Chou et al. |
| 2018/0122823 A1 | 5/2018 | Li et al. |
| 2019/0181041 A1 | 6/2019 | Lu et al. |
| 2020/0075498 A1 | 3/2020 | Kume |
| 2020/0176312 A1* | 6/2020 | Rabie ................ H01L 21/31138 |
| 2022/0051968 A1 | 2/2022 | Wu |
| 2022/0084908 A1 | 3/2022 | Shih et al. |

* cited by examiner

THROUGH-SUBSTRATE VIA FORMATION TO ENLARGE ELECTROCHEMICAL PLATING WINDOW

REFERENCE TO RELATED APPLICATION

This Application is a Divisional of U.S. application Ser. No. 17/150,048, filed on Jan. 15, 2021, the contents of which are hereby incorporated by reference in their entirety.

BACKGROUND

A through-substrate via (TSV) is a conductive structure that passes through a semiconductor substrate. TSVs are used to electrically couple conductive structures on opposing sides of the semiconductor substrate. TSVs are used in many modern-day integrated chip structures, such as backside illuminated (BSI) image sensors, multi-dimensional integrated chips (e.g., 3DIC), or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
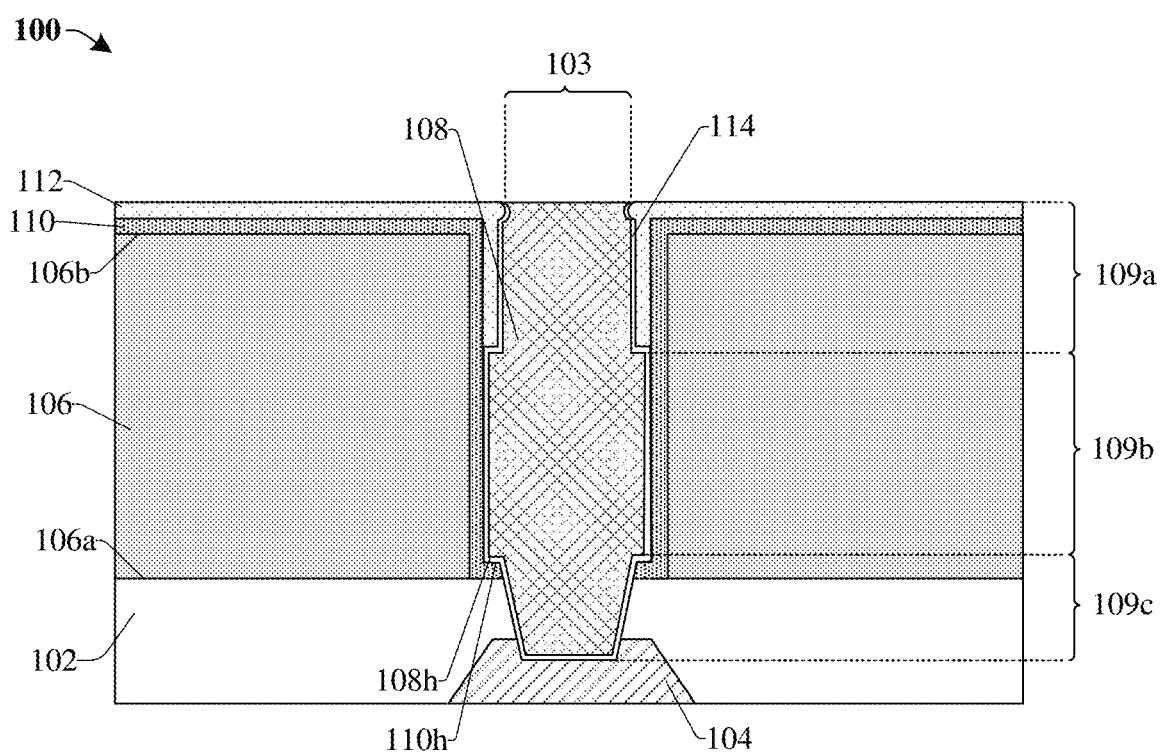
FIG. 1 illustrates a cross-sectional view of some embodiments of an integrated chip (IC) comprising a disclosed through-substrate via (TSV) structure having multiple portions with different widths.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A through-substrate via (TSV) may be formed by selectively exposing a first side of a semiconductor substrate to an etchant according to a masking layer to form an opening that extends through the semiconductor substrate and to a conductive structure disposed along a second side of the semiconductor substrate. After the opening is formed, a dielectric layer may be formed along inner sidewalls of the semiconductor substrate defining the opening, and a conductive material may be formed within the opening over the dielectric layer and on the conductive feature. A planarization process is then performed to remove excess of the conductive material from over the first side of the semiconductor substrate and to form a TSV extending from the first side of the semiconductor substrate to the conductive structure.

As the size of integrated chip components decreases, a size of the opening used to form a TSV may also decrease. Decreasing a size of the opening may improve a reliability of an integrated chip. For example, decreasing a size of the opening may allow a size of the TSV to correspond to an underlying conductive structure, thereby mitigating over-etching and corresponding electrical shorts. It may also allow less etchant into the opening, thereby reducing damage to smaller and/or thinner conductive structures. However, the smaller size of the opening may affect an ability of an electroplating process to effectively form a conductive material within the opening. For example, as a size of the opening decreases it can become more difficult for metal ions to get into the opening, resulting in voids in a resulting TSV. Voids increase a resistance of the TSV, hence decreasing its effectiveness in conducting an electrical charge through the semiconductor substrate.

In the present disclosure, a method of manufacturing a TSV is presented to produce more efficient integrated circuits. The method comprises performing a first etching process to form a first opening through a semiconductor substrate and lining sidewalls of the semiconductor substrate defining the first opening with a dielectric layer. A blocking layer and a temporary blocking layer are subsequently formed along sidewalls of the dielectric layer. A second etching process is then performed with the blocking layer and the temporary blocking layer in place to form a second opening extending through the dielectric layer to an underlying conductive structure. The blocking layer and temporary blocking layer block some of the etchant used in the second etching process, so that the etchant is confined away from the dielectric layer and the second opening is formed to have a maximum width less than that of the first opening. A conductive material is then formed within the first and second openings to define a through-substrate via (TSV). Using the temporary blocking layer to reduce a width of the second opening allows for the first opening to be formed to a relatively large width that mitigates voids in the TSV, while the smaller width of the second opening may improve a reliability of an associated integrated chip by reducing over-etching of the TSV opening and/or damage to the conductive structure.

FIG. 1 illustrates a cross-sectional view 100 of some embodiments of an integrated chip (IC) comprising a through-substrate via (TSV) structure.

The IC comprises a dielectric structure 102 disposed along a first side 106a of a semiconductor substrate 106. The dielectric structure 102 surrounds a conductive structure 104. In some embodiments, the dielectric structure 102 may comprise an inter-level dielectric (ILD) structure and the conductive structure 104 may comprise a conductive interconnect. A through-substrate via (TSV) 108 extends through an opening 103 defined by sidewalls of the semiconductor substrate 106. In some embodiments, the TSV 108 extends from a second side 106b of the semiconductor substrate 106 to the conductive structure 104. An insulating structure 110 overlies the semiconductor substrate 106 and laterally separates the semiconductor substrate 106 from the TSV 108. The insulating structure 110 comprises a horizontally-extending surface 110h underlying a horizontally-extending surface 108h of the TSV 108. A blocking layer 112 overlies the semiconductor substrate 106 and is disposed along inner sidewalls of the insulating structure 110, providing another layer of separation between the TSV 108 and the semiconductor substrate 106. In some embodiments, the TSV 108 may comprise a diffusion barrier layer 114 arranged along one or more outer surfaces of the TSV 108.

In some embodiments, a bottom surface of the blocking layer 112 may directly overlie the TSV 108. In some embodiments, the insulating structure 110 may have a height greater than a height of the blocking layer 112. In some embodiments, the blocking layer 112 directly overlies the horizontally-extending surface 110h of the insulating structure 110.

In some embodiments, the TSV 108 comprises a plurality of different portions 109a-109c having different widths. For example, in some embodiments, the TSV 108 may comprise a first portion 109a, a second portion 109b, and a third portion 109c respectively having different widths. The first portion 109a is arranged between inner sidewalls of the blocking layer 112, the second portion 109b is arranged between inner sidewalls of the insulating structure 110, and the third portion 109c is arranged between inner sidewalls of the dielectric structure 102. In some embodiments, the first portion 109a of the TSV 108 has a smaller maximum width than that of the second portion 109b of the TSV 108. In some embodiments, the third portion 109c of the TSV 108 has a smaller maximum width than that of the second portion 109b of the TSV 108. This allows the TSV 108 to be wider through the semiconductor substrate 106, while maintaining a smaller width at the point at which the TSV 108 contacts the conductive structure 104.

In some embodiments, innermost sidewalls of the insulating structure 110 are aligned along a line with the inner sidewalls of the dielectric structure 102, and in further embodiments, the inner sidewalls slant inwards. In some embodiments, the first portion 109a of the TSV 108 directly overlies the horizontally-extending surface 110h of the insulating structure 110. In some embodiments, the outer sidewalls of the third portion 109c of the TSV 108 are slanted at an angle other than 90 degrees as measured with respect to the first side 106a of the semiconductor substrate 106. The third portion 109c of the TSV 108 may have a bottom surface recessed below a top surface of the conductive structure 104. In such embodiments, innermost sidewalls of the insulating structure 110 and interior sidewalls of the dielectric structure 102 may be slanted inwards.

A width of the TSV 108 and the corresponding opening 103 correspond to an ability of an electroplating process to effectively form a conductive material within the opening 103. For example, as a width of the opening 103 decreases it can become more difficult for metal ions to get into the opening 103, resulting in voids in the TSV 108. Furthermore, a width of the TSV 108 and the corresponding opening 103 also corresponds to a reliability of the integrated chip. For example, as a width of the opening 103 increases over-etching and/or damage to the conductive structure 104 may increase. The different widths of the plurality of different portions 109a-109c of the TSV 108 allow for the opening 103 to have both a first width that decreases voids within the TSV 108 as well as a second width that limits over-etching and/or damage to the conductive structure 104, thereby providing the TSV 108 with both good electrical properties and good reliability.

Figure 2:
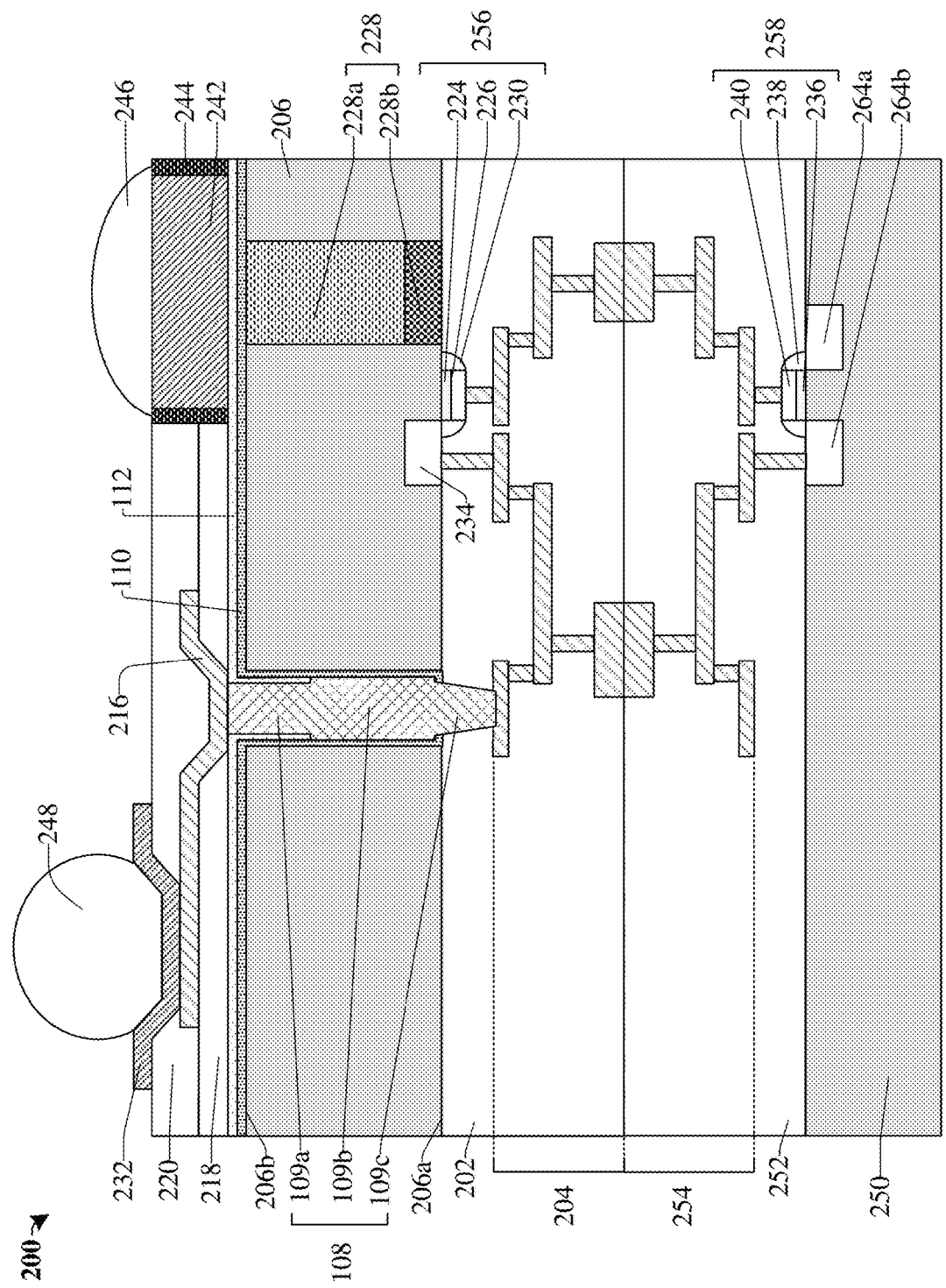
FIG. 2 illustrates a cross-sectional view of some additional embodiments of an image sensor IC comprising a disclosed TSV structure.

FIG. 2 illustrates a cross-sectional view 200 of some embodiments of an IC comprising a through-substrate via (TSV) structure.

The IC comprises a first inter-layer dielectric (ILD) structure 202 disposed along a first side 206a of a first semiconductor substrate 206. The first ILD structure 202 surrounds a first plurality of interconnects 204. A through-substrate via (TSV) 108 extends through the first semiconductor substrate 206. In some embodiments, the TSV 108 extends from a second side 206b of the first semiconductor substrate 206 to one of the first plurality of interconnects 204. In some embodiments, the TSV 108 may extend to an interconnect wire that is a closest interconnect wire to the first semiconductor substrate 206.

In some embodiments, the TSV 108 comprises a plurality of different portions 109a-109c having different widths. For example, the TSV 108 may comprise a first portion 109a, a second portion 109b, and a third portion 109c respectively having different widths. In some embodiments, the first portion 109a may have a width that is substantially equal to a width of the third portion 109c. In some embodiments, the first portion 109a may have a minimum width that is greater than a minimum width of the third portion 109c (due to a temporary blocking layer used during etching the opening for the TSV 108).

An insulating structure 110 is arranged along the second side 206b of the first semiconductor substrate 206 and laterally separates the first semiconductor substrate 206 from the TSV 108. The insulating structure 110 comprises a horizontally-extending surface extending outward from a sidewall of the insulating structure 110 to under the TSV 108. A blocking layer 112 overlies the first semiconductor substrate 206 and is disposed along inner sidewalls of the insulating structure 110, providing another layer of separation between the TSV 108 and the first semiconductor substrate 206. In some embodiments, the blocking layer 112 has a bottom surface that is higher than a bottom surface of the insulating structure 110.

In some embodiments, the first semiconductor substrate 206 may be or otherwise comprise, for example, a bulk silicon substrate, a bulk germanium substrate, a group III-V substrate, or some other suitable semiconductor substrate. In some embodiments, the first ILD structure 202 may comprise a plurality of stacked ILD layers that respectively comprise silicon dioxide, silicon nitride, some other suitable low-k dielectric(s), or any combination of the foregoing. In some embodiments, the blocking layer 112 and/or the insulating structure 110 may comprise or be a nitride, an oxide, a carbide, or the like. The TSV 108 and/or the first plurality of interconnects 204 are conductive and may be or otherwise comprise, for example, tungsten, aluminum copper, copper, aluminum, some other suitable metal(s), or some other suitable conductive material(s).

A redistribution layer 216 contacts an upper surface of the TSV 108. A first dielectric material 218 is disposed over an upper surface of the blocking layer 112, such that it contacts outer sidewalls of the redistribution layer 216. A second dielectric material 220 is disposed over the first dielectric material 218 such that it contacts a top surface of the redistribution layer 216 and inner sidewalls of the redistribution layer 216. In some embodiments, a bottom surface of the second dielectric material 220 is recessed below a top surface of the first dielectric material 218.

In some embodiments, an under-bump metallization 232 is disposed above a top surface of the redistribution layer 216. Further embodiments comprise a solder bump 248 electrically coupled to the under-bump metallization 232. The redistribution layer 216, the under-bump metallization 232, and the solder bump 248 are conductive and may be or otherwise comprise, for example, tungsten, aluminum copper, copper, aluminum, some other suitable metal(s), or some other suitable conductive material(s). The first dielectric material 218 and the second dielectric material 220 may be or otherwise comprise, for example, silicon dioxide, silicon nitride, or any combination of the foregoing.

In some embodiments, a photodiode 228 is disposed within the first semiconductor substrate 206. The photodiode 228 has a first region 228a with a first doping type (e.g. n-type) and an abutting second region 228b with a second doping type (e.g. p-type) that is different than the first doping type. A first transistor 256 is arranged along the first side 206a of the first semiconductor substrate 206. The first transistor 256 comprises a first gate dielectric layer 224 that is disposed along the first side 206a of the first semiconductor substrate 206 and a first gate electrode 226 under the first gate dielectric layer 224. In some embodiments, a first pair of sidewall spacers 230 are arranged on opposing sides of the first gate electrode 226. A floating diffusion well 234 is disposed within the first semiconductor substrate 206, and the first transistor 256 is laterally between the floating diffusion well 234 and the photodiode 228. The first gate dielectric layer 224 may be or otherwise comprise, for example, silicon dioxide, silicon nitride, or any combination of the foregoing. The first pair of sidewall spacers 230 may be or otherwise comprise, for example, a nitride, an oxide, or any combination of the foregoing. The first gate electrode 226 may be or otherwise comprise, for example, doped polysilicon, metal, or some other suitable conductive material(s).

A color filter 242 overlies the blocking layer 112 and is configured to transmit specific wavelengths of incident radiation. In some embodiments, the color filter 242 is arranged within a grid structure 244 disposed onto the blocking layer 112. A micro-lens 246 is arranged over the color filter 242. In some embodiments, the micro-lens 246 may have a substantially flat bottom surface abutting the color filter 242 and a curved upper surface configured to focus incident radiation towards the photodiode 228. The color filter 242 may have sidewalls defined by sidewalls of the first dielectric material 218 and the second dielectric material 220.

In some embodiments, a second ILD structure 252 is disposed below the first ILD structure 202. The second ILD structure 252 surrounds a second plurality of interconnects 254. In further embodiments, a second semiconductor substrate 250 is disposed below the second ILD structure 252. The second semiconductor substrate 250 may be or otherwise comprise, for example, a bulk silicon substrate, a bulk germanium substrate, a group III-V substrate, or some other suitable semiconductor substrate. The second ILD structure 252 may be or otherwise comprise, for example, silicon dioxide, silicon nitride, some other suitable low-k dielectric (s), or any combination of the foregoing. The second plurality of interconnects 254 are conductive and may be or otherwise comprise, for example, tungsten, aluminum copper, copper, aluminum, some other suitable metal(s), or some other suitable conductive material(s).

A second transistor 258 is arranged on the second semiconductor substrate 250. The second transistor 258 comprises a second gate dielectric layer 236 that is disposed over the upper surface of the second semiconductor substrate 250 and a second gate electrode 240 over the second gate dielectric layer 236. In some embodiments, a second pair of sidewall spacers 238 are arranged on opposing sides of the second gate electrode 240. A second diffusion well 264a and a third diffusion well 264b are disposed within the second semiconductor substrate 250 and are under the second transistor 258. In some embodiments, the second gate dielectric layer 236 may be or otherwise comprise, for example, silicon dioxide, silicon nitride, or any combination of the foregoing. The second pair of sidewall spacers 238 may be or otherwise comprise, for example, a nitride, an oxide, or any combination of the foregoing. The second gate electrode 240 may be or otherwise comprise, for example, doped polysilicon, metal, or some other suitable conductive material(s).

Figure 3:
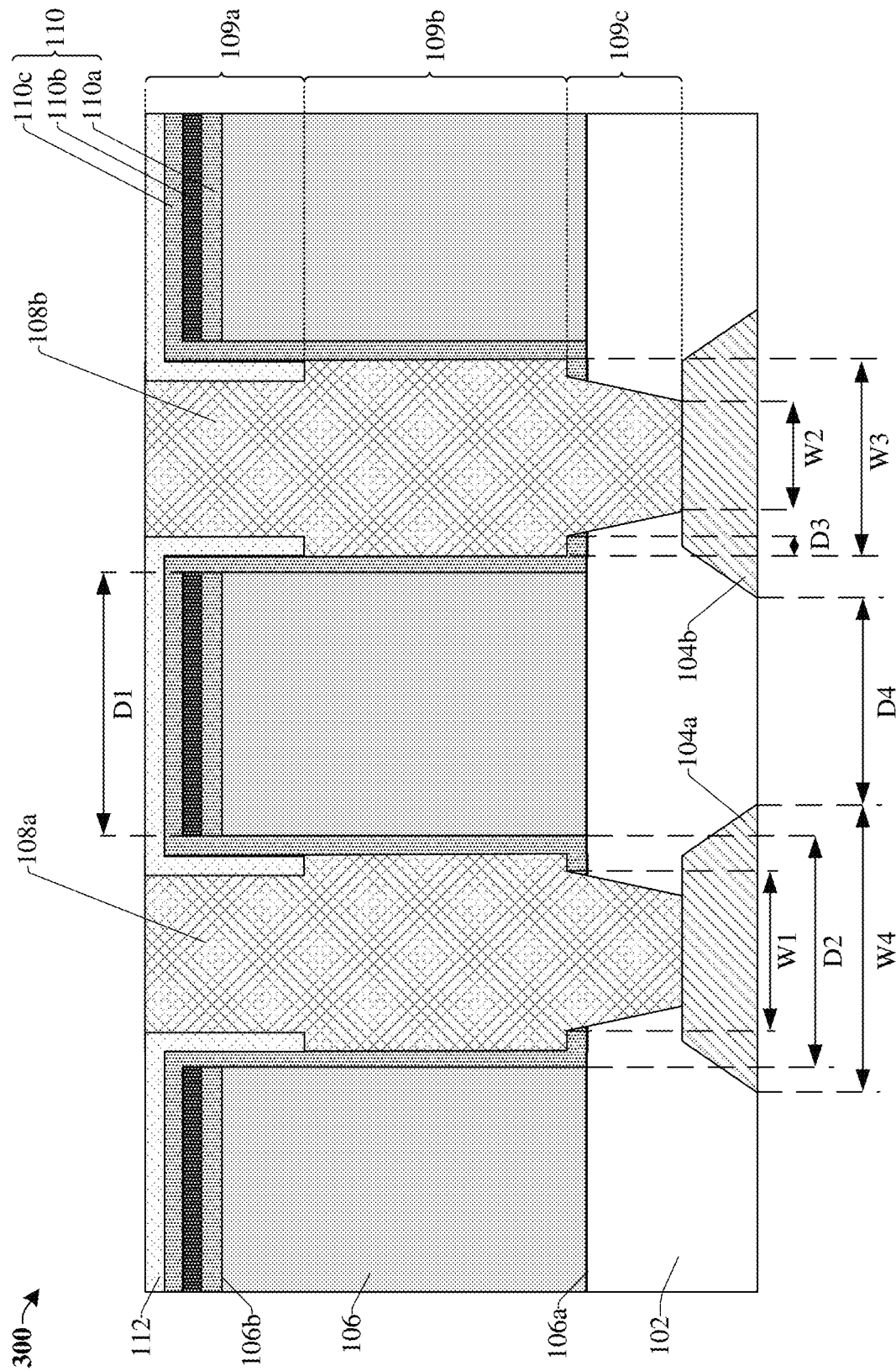
FIG. 3 illustrates a cross-sectional view of some additional embodiments of an IC comprising a disclosed TSV structure.

FIG. 3 illustrates a cross-sectional view 300 of some embodiments of an IC comprising a through-substrate via (TSV) structure.

The IC comprises a dielectric structure 102 (e.g., an ILD structure) arranged along a first side 106a of a semiconductor substrate 106. The dielectric structure 102 surrounds a plurality of conductive structures 104a-104b. In some embodiments, the plurality of conductive structures 104a-104b comprise a first conductive structure 104a (e.g., a first interconnect wire) and a second conductive structure 104b (e.g., a second interconnect wire). A plurality of TSVs 108a-108b extend through the semiconductor substrate 106. In some embodiments, the plurality of TSVs 108a-108b extend from a second side 106b of the semiconductor substrate 106 to the plurality of conductive structures 104a-104b. For example, the first TSV 108a may extend from the second side 106b of the semiconductor substrate 106 to the first conductive structure 104a and the second TSV 108b may extend from the second side 106b of the semiconductor substrate 106 to the second conductive structure 104b.

An insulating structure 110 is arranged along the second side 106b of the semiconductor substrate 106 and continuously extends along sidewalls of the semiconductor substrate 106. The insulating structure 110 laterally separates the semiconductor substrate 106 from the plurality of TSVs 108a-108b. In some embodiments, the insulating structure 110 may comprise a plurality of different dielectric layers 110a-110c. For example, the insulating structure 110 may comprise a first dielectric layer 110a and a second dielectric layer 110b stacked onto the second side 106b of the semiconductor substrate 106. In some embodiments, the insulating structure 110 may further comprise a third dielectric layer 110c arranged over the second dielectric layer 110b and extending along sidewalls of the first dielectric layer 110a, the second dielectric layer 110b, and the semiconductor substrate 106. The insulating structure 110 may have a horizontally-extending surface directly underlying the plurality of TSVs 108a-108b. In some embodiments, the first dielectric layer 110a may comprise an oxide, the second dielectric layer 110b may comprise a nitride, and the third dielectric layer 110c may comprise an oxide.

A blocking layer 112 overlies the insulating structure 110 and lines a part, but not all, of inner sidewalls of the insulating structure 110. The blocking layer 112 may further extend over the plurality of TSVs 108a-108b so that an imaginary vertical line that is perpendicular to the first side 106a of the semiconductor substrate 106 extends through the blocking layer 112 and the plurality of TSVs 108a-108b.

The plurality of TSV 108a-108b respectively comprise a plurality of different portions 109a-109c having different widths. For example, the plurality of TSVs 108a-108b may comprise a first portion 109a, a second portion 109b, and a third portion 109c respectively having different widths. The third portion 109c may comprise a first width W1 between inner sidewalls of the insulating structure 110 and a second width W2 at bottommost surfaces of the plurality of TSVs 108a-108b. In some embodiments, the first width W1 may be greater than the second width W2. In some embodiments, the first width W1 may be between approximately 500 nm and approximately 700 nm, between approximately 550 nm and approximately 650 nm, or other suitable values. In some embodiments, the second width W2 may be between approximately 400 nm and approximately 600 nm, between approximately 450 nm and approximately 550 nm, or other suitable values. In some embodiments, the second portion 109b may comprise a third width W3 between outermost sidewalls of the TSV 108. The third width W3 may be greater than the second width W2. In some embodiments, the third width W3 may be between 110% and 150% larger than the second width W2, thereby allowing enough space to mitigate voids in the TSV while preventing over-etching and/or damage to the plurality of conductive structures 104a-104b. In some embodiments, the third width W3 may be between approximately 700 nm and approximately 800 nm, between approximately 725 nm and approximately 775 nm, or other suitable values.

The plurality of TSVs 108a-108b may be laterally separated from one another by a first distance D1. In some embodiments, the first distance D1 may be between approximately 550 nm and approximately 650 nm, between approximately 575 nm and approximately 625 nm, or other suitable values. In some embodiments, the plurality of TSVs 108a-108c may be disposed within openings defined by sidewalls that are separated by a second distance D2. In some embodiments, the second distance D2 may be between 750 nm and 850 nm, between approximately 775 nm and approximately 825 nm, or other suitable values. In some embodiments, the first distance D1 may be greater than the second width D2. The horizontally-extending surface of the insulating structure 110 may extend a third distance D3. In some embodiments, the third distance D3 may be between 70 nm and 90 nm, between approximately 75 nm and approximately 85 nm, or other suitable values. Each of the plurality of conductive structures 104a-104b may have a fourth width W4, and each of the plurality of conductive structures 104a-104b may be separated by a fourth distance D4. The fourth width W4 may be between approximately 750 nm and approximately 1000 nm, between approximately 800 nm and approximately 900 nm, or other suitable values. The fourth distance D4 may be between approximately 400 nm and approximately 600 nm, between approximately 450 nm and approximately 550 nm, or other suitable values.

Figure 4A:
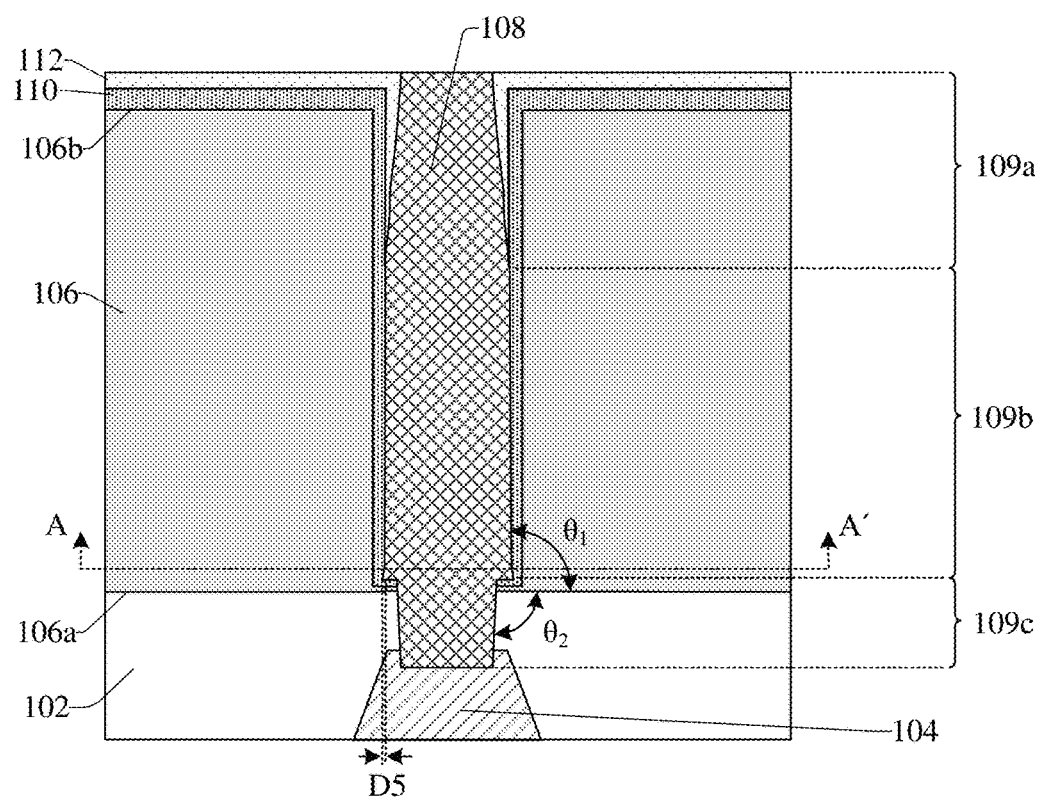
FIG. 4A illustrates a cross-sectional view of some additional embodiments of an IC comprising a disclosed TSV structure.

FIG. 4A illustrates a cross-sectional view 400A of some embodiments of an IC comprising a through-substrate via (TSV) structure.

The IC comprises a conductive structure 104 arranged within a dielectric structure 102 disposed along a first side 106a of a semiconductor substrate 106. The semiconductor substrate 106 surrounds a through-substrate via (TSV) 108. In some embodiments, the TSV 108 extends through the semiconductor substrate 106 to a top surface of the conductive structure 104. An insulating structure 110 overlies the semiconductor substrate 106 and laterally separates the semiconductor substrate 106 from the TSV 108. The insulating structure 110 comprises a horizontally-extending surface 110h underlying the TSV 108. A blocking layer 112 overlies the semiconductor substrate 106 and is disposed along inner sidewalls of the insulating structure 110. In some embodiments, the blocking layer 112 may comprise an inner sidewall that extends from a top surface of the blocking layer 112 to an inner sidewall of the insulating structure 110. In some embodiments, the blocking layer 112 may have a thickness that gradually decreases between a first value at a top surface of the blocking layer 112 and a second value at a bottom surface of the blocking layer 112.

The TSV 108 comprises a plurality of different portions 109a-109c. In some embodiments, the plurality of different portions 109a-109c comprise a first portion 109a arranged along a second side 106b of the semiconductor substrate 106, a second portion 109b overlying the horizontally-extending surface 110h of the insulating structure 110, and a third portion 109c directly underlying the second portion 109b. In some embodiments, the second portion 109b has a greater maximum width than that of the third portion 109c. In some embodiments, the second portion 109b of the TSV 108 may comprise a lower surface in direct contact with the horizontally-extending surface 110h of the insulating structure 110. In some embodiments, the lower surface of the second portion 109b of the TSV 108 may horizontally extend into a vertical portion of the insulating structure 110 by a fifth distance D5. In some embodiments, a portion of the semiconductor substrate 106 may be disposed directly under the horizontally-extending surface 110h of the insulating structure 110.

In some embodiments, the second portion 109b of the TSV 108 has sidewalls that are angled at first angle $\theta_1$ with respect to the first side 106a of the semiconductor substrate 106 and the third portion 109c of the TSV 108 comprises sidewalls that are angled at a second angle $\theta_2$ with respect to the first side 106a of the semiconductor substrate 106. The first angle $\theta_1$ is different than the second angle $\theta_2$.

Figure 4B:
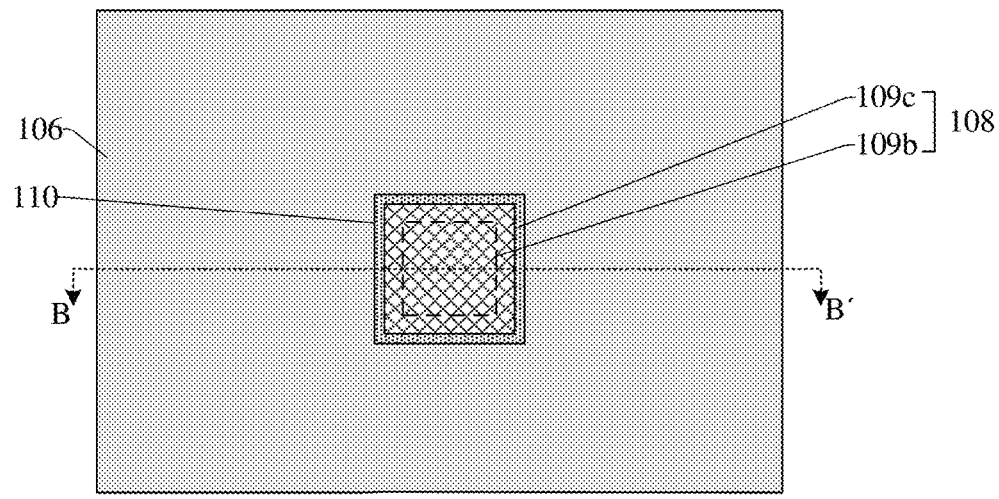
FIG. 4B illustrates some embodiments of a top view of the IC of FIG. 4A.

FIG. 4B illustrates a cross-section 400B of some embodiments of an IC comprising a TSV structure. In some embodiments, the IC may be the IC described in FIG. 4A. The TSV 108 is surrounded by the insulating structure 110. The semiconductor substrate 106 surrounds the insulating structure 110. The third portion 109c of the TSV 108 may be smaller than the second portion 109b of the TSV 108. In some embodiments, the third portion 109c of the TSV 108 may have a surface area less than half than that of the second portion 109b of the TSV 108. In some embodiments, the TSV 108 and the insulating structure 110 may each have a square-shaped profile. other some embodiments (not shown), the TSV 108 and the insulating structure 110 may each have a circular-shaped profile or a square-shaped profile with rounded edges.

With reference to FIGS. 5-13, a series of cross sections 500-1300 illustrate some embodiments of a method for forming an IC comprising a TSV. The IC may, for example, correspond to the IC of FIG. 1. Although FIGS. 5-13 are described in relation to a method, it will be appreciated that the structures disclosed in FIGS. 5-13 are not limited to such a method, but instead may stand alone as structures independent of the method.

Figure 5:
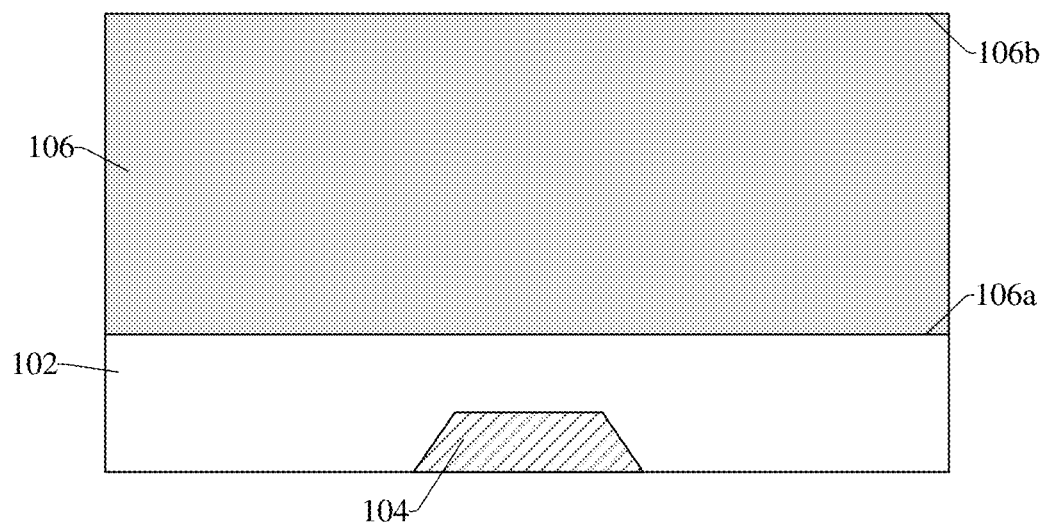
FIGS. 5-13 illustrate a series of cross-sectional views for some embodiments of a method of forming an IC comprising a disclosed TSV structure.

As illustrated by the cross-sectional view 500 of FIG. 5, a dielectric structure 102 and a conductive structure 104 are formed along a first side 106a of a semiconductor substrate 106. In some embodiments, the conductive structure 104 may be formed within the dielectric structure 102. In some embodiments, the semiconductor substrate 106 may be or otherwise comprise, for example, a bulk silicon substrate, a bulk germanium substrate, a group III-V substrate, or some other suitable semiconductor substrate. The dielectric structure 102 may be or otherwise comprise, for example, silicon dioxide, silicon nitride, some other suitable low-k dielectric(s), or any combination of the foregoing. The conductive structure 104 is conductive and may be or otherwise comprise, for example, tungsten, aluminum copper, copper, aluminum, some other suitable metal(s), or some other suitable conductive material(s).

In some embodiments, the dielectric structure 102 may be formed by way of a deposition process (e.g., a chemical vapor deposition (CVD) process, a plasma enhanced CVD process, a physical vapor deposition process, or the like). In some embodiments, the conductive structure 104 may comprise an interconnect (e.g., an interconnect wire). In various embodiments, the interconnect may be formed by way of a damascene process (e.g., a single damascene process, a dual damascene process), in which the dielectric structure 102 is selectively patterned to define an opening that is subsequently filled with a conductive material.

Figure 6:
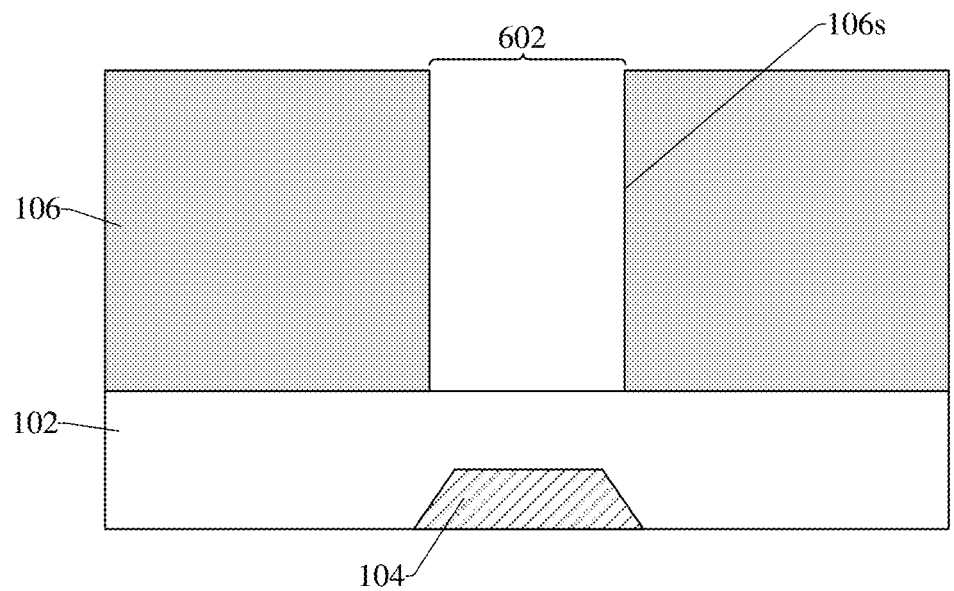

As illustrated by the cross-sectional view 600 of FIG. 6, a first hole 602 is etched into the semiconductor substrate 106 by a first etching process. The first hole 602 is defined by inner sidewalls 106s of the semiconductor substrate 106 and leaves a portion of the dielectric structure 102 exposed. In some embodiments (not shown), the first etching process may be performed by forming a mask (e.g., a hard mask, a photoresist, or the like) over the semiconductor substrate 106, then exposing the semiconductor substrate 106 to a first etchant according to the mask to define the first hole 602.

Figure 7:
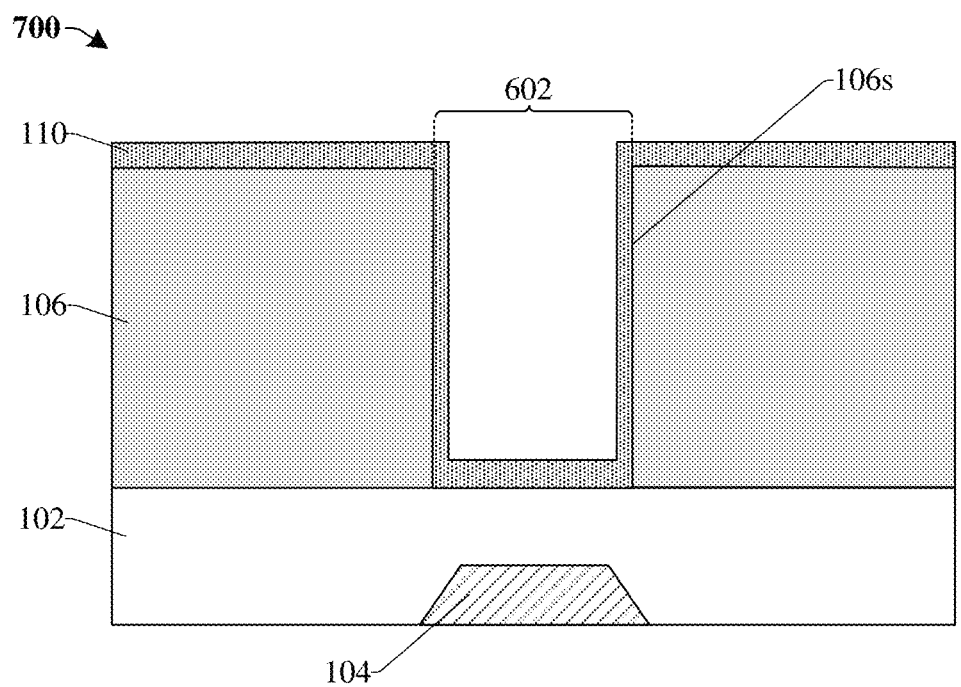

As illustrated by the cross-sectional view 700 of FIG. 7, an insulating structure 110 is formed over the semiconductor substrate 106. The insulating structure 110 is further formed along the inner sidewalls 106s of the semiconductor substrate 106 and over the exposed portion of the dielectric structure 102. The insulating structure 110 may be formed by, for example, physical vapor deposition, chemical vapor deposition, or some other suitable formation process. The insulating structure 110 may be or otherwise comprise, for example, an oxide (e.g., silicon oxide), a nitride (e.g., silicon nitride), a carbide (e.g., silicon carbide), or any combination of the foregoing.

In some embodiments (not shown), the insulating structure 110 may comprise a plurality of dielectric layers. For example, the insulating structure 110 may comprise a first dielectric layer and/or a second dielectric layer formed over the semiconductor substrate 106 prior to etching the first hole 602, and a third dielectric layer formed over the first dielectric layer, the second dielectric layer, and along inner sidewalls of the semiconductor substrate 106 after etching the first hole 602. In such embodiments, the first dielectric layer and/or the second dielectric layer may be used as a part of the mask to etch the first hole 602.

Figure 8:
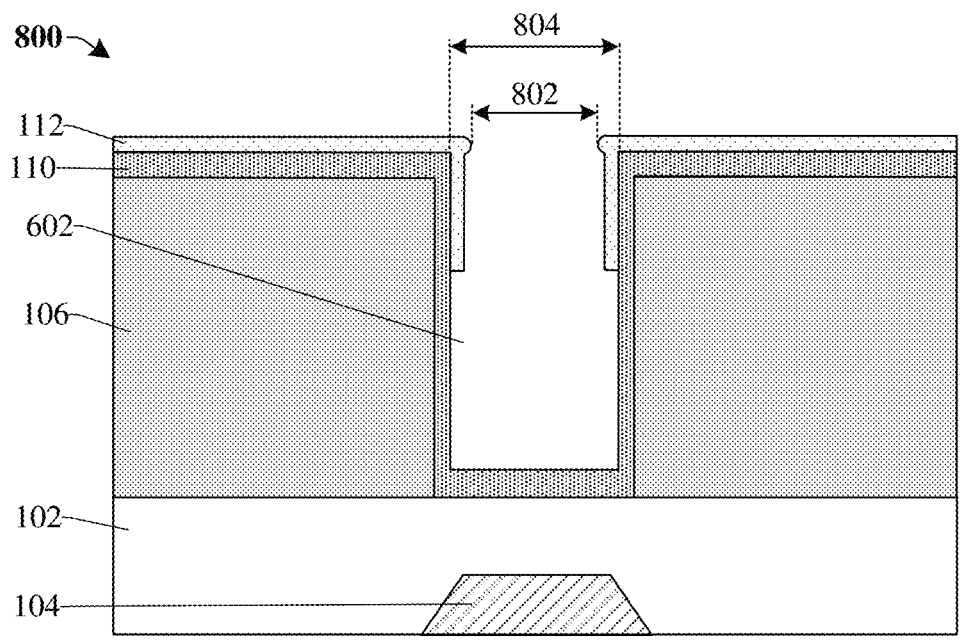

As illustrated by the cross-sectional view 800 of FIG. 8, a blocking layer 112 is formed over the insulating structure 110 and along inner sidewalls of the insulating structure 110. The blocking layer 112 reduces a width of the first hole 602 along the second side of the semiconductor substrate 106.

The blocking layer 112 may be formed by a deposition process (e.g., a physical vapor deposition, a chemical vapor deposition, or some other suitable formation process). In some embodiments, the formation process results in a buildup of material at an edge of the blocking layer 112. The buildup comprises a surface of the blocking layer 112 that protrudes outward from a sidewall of the blocking layer 112 as a protrusion. The blocking layer 112 reduces a width of the first hole 602 along the second side of the semiconductor substrate 106 from a first width 802 to a second width 804.

In some embodiments, the formation process for the blocking layer 112 may not completely fill the first hole 602, but may instead form the blocking layer 112 to contact a partiality of the inner sidewalls of the insulating structure 110, so as to serve as a blocking layer for a subsequent etch of the dielectric structure 102. The blocking layer 112 may be or otherwise comprise, for example, silicon dioxide, silicon nitride, or any combination of the foregoing.

Figure 9:
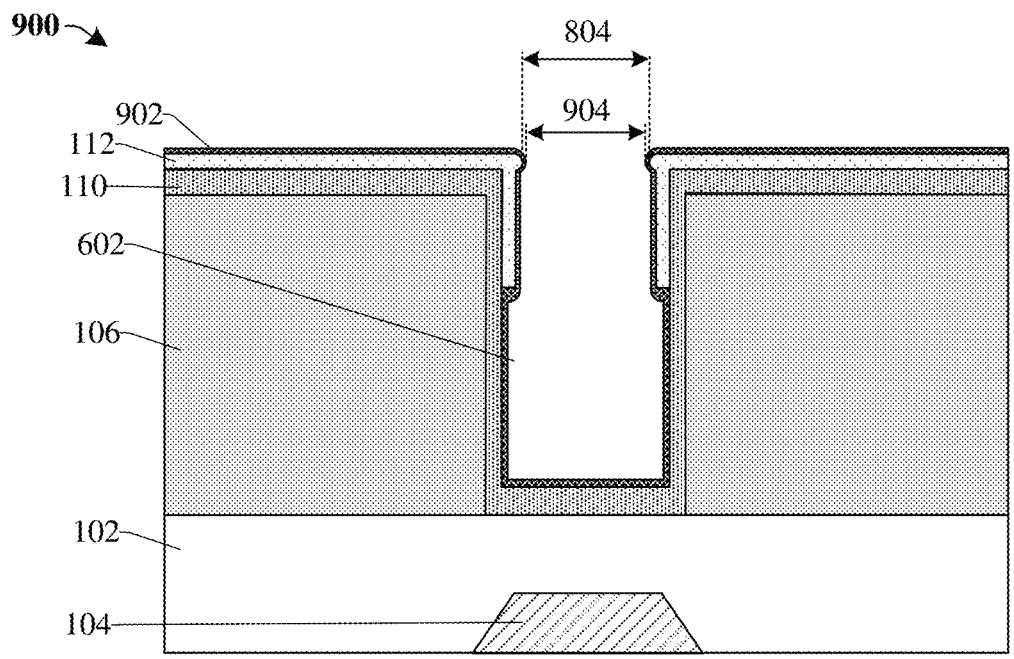

As illustrated by the cross-sectional view 900 of FIG. 9, a temporary blocking layer 902 is disposed over the blocking layer 112, along inner sidewalls of the blocking layer 112, along inner sidewalls of the insulating structure 110, and over an exposed surface of the insulating structure 110. The temporary blocking layer 902 further reduces a width of the first hole 602 along the second side of the semiconductor substrate 106 from a second width 804 to a third width 904.

In some embodiments, the formation process results in a buildup of material at an edge of the temporary blocking layer 902. The temporary blocking layer 902 may be or otherwise comprise, for example, silicon dioxide, silicon nitride, titanium nitride, or any combination of the foregoing. In some embodiments, the temporary blocking layer 902 may comprise a different material than the blocking layer 112. Utilizing different materials for the blocking layer 112 and the temporary blocking layer 902, improves a resistance to etching (e.g., by providing for different etch selectivities to an etchant). By improving a resistance to etching, the different material of the blocking layer 112 and the temporary blocking layer 902 can increase a setback of a subsequently formed second hole (e.g., second hole 1002 of FIG. 10) from sidewalls of the semiconductor substrate 106. In other embodiments, the temporary blocking layer 902 may comprise a same material than the blocking layer 112.

Figure 10:
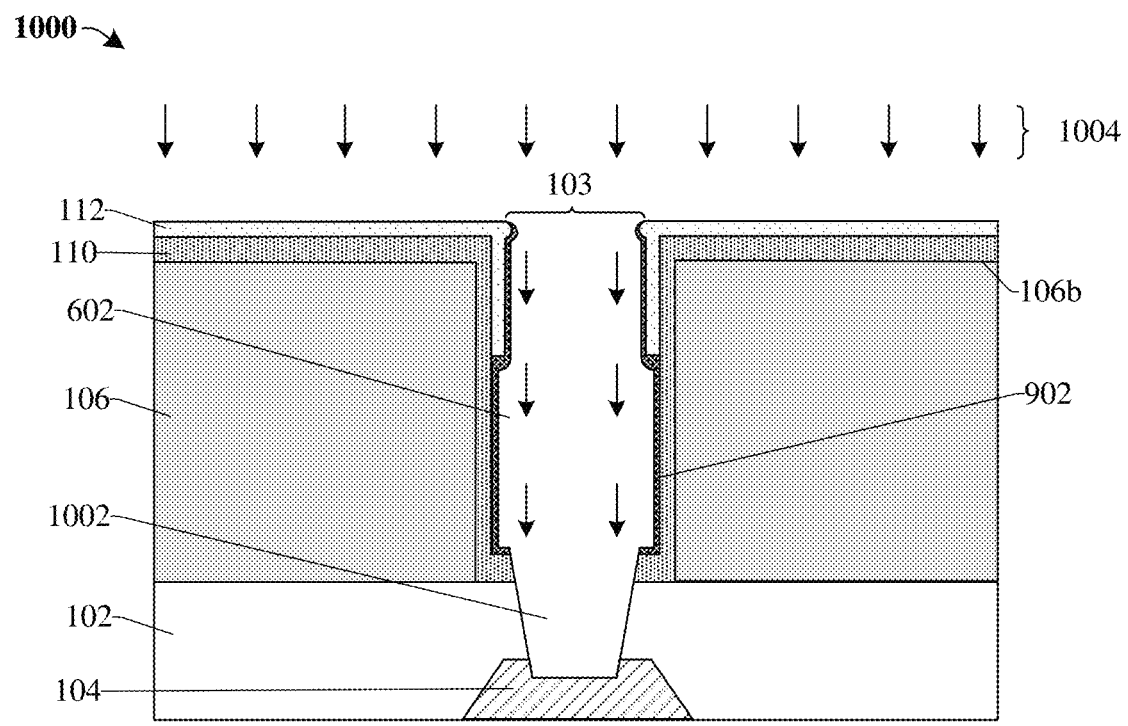

As illustrated by the cross-sectional view 1000 of FIG. 10, a second hole 1002 is etched into the temporary blocking layer 902, the insulating structure 110, and the dielectric structure 102 by a second etching process to define an opening 103 that extends through the semiconductor substrate 106 to the conductive structure 104. The second etching process exposes the temporary blocking layer 902, the insulating structure 110, and the dielectric structure 102 to a second etchant 1004. Because the blocking layer 112 and the temporary blocking layer 902 overhang a part of the first hole 602, the blocking layer 112 and the temporary blocking layer 902 mitigate an amount of the second etchant 1004 that reaches outer sidewalls of the temporary blocking layer 902, resulting in a second hole 1002 that is set back from sidewalls of the temporary blocking layer 902. In some embodiments, the overhang of the blocking layer 112 and the temporary blocking layer 902 also prevents damage to sidewalls of the insulating structure 110, thereby improving electrical isolation between the semiconductor substrate 106 and a subsequently formed TSV (e.g., TSV 108 of FIG. 14).

In some embodiments, the second etchant 1004 may remove the temporary blocking layer 902 from over the second side 106b of the semiconductor substrate 106, while leaving the temporary blocking layer 902 along sidewalls of the semiconductor substrate 106 defining the first hole 602. In some embodiments, the second etchant 1004 may comprise a dry etchant (e.g., a plasma etchant, an ion bombardment etchant, or the like). In some embodiments, the second hole 1002 extends into the conductive structure 104. The second etching process results in the insulating structure 110 having a horizontally-extending surface surrounding the second hole 1002.

Figure 11:
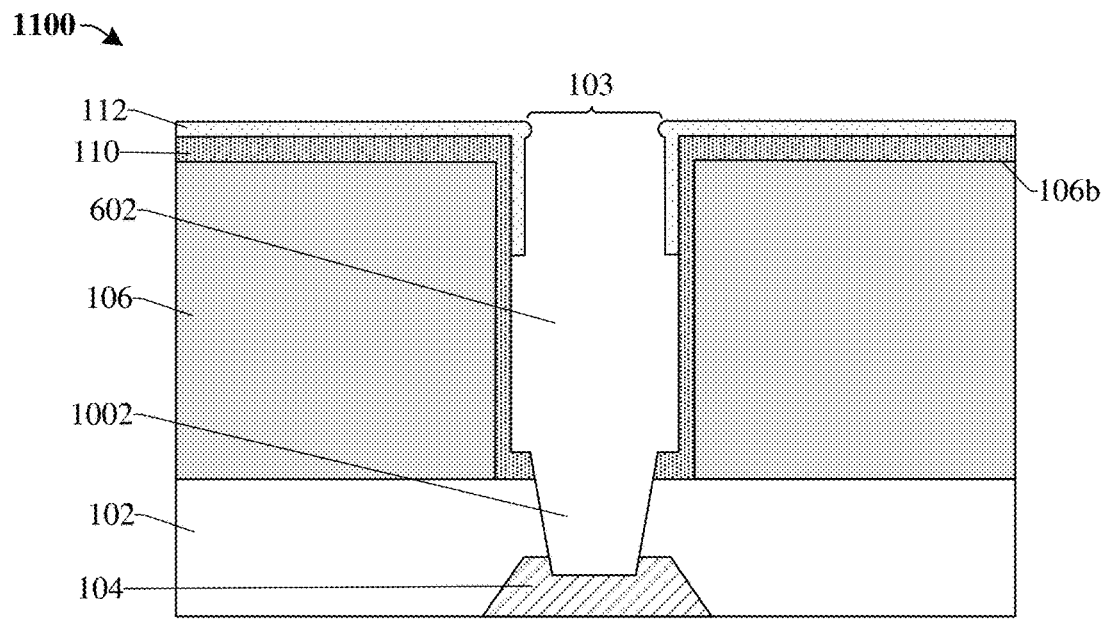

As illustrated by the cross-sectional view 1100 of FIG. 11, a remainder of the temporary blocking layer 902 is removed by a removal process. The removal process may be or otherwise comprise, for example, a wet etching process. In various embodiments, the wet etching process may utilize a wet etchant comprising hydrofluoric acid (HF), potassium hydroxide (KOH), an alkali wet etchant, or the like. In some embodiments, the wet etchant may reduce a size of the protrusions of the blocking layer 112, thereby increasing a width of the opening 103 along a second side 106b of the semiconductor substrate 106 and reducing a resistance of a subsequently formed TSV (e.g., TSV 108 of FIG. 13).

Figure 12:
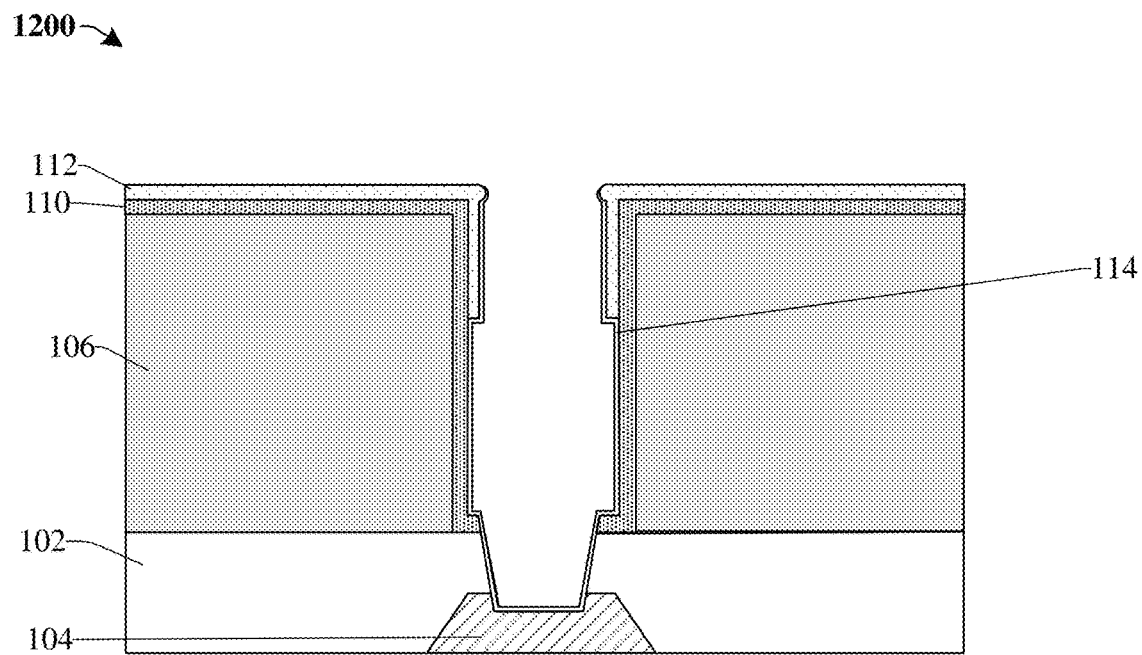

As illustrated by the cross-sectional view 1200 of FIG. 12, a diffusion barrier layer 114 is formed along inner sidewalls of the blocking layer 112, inner sidewalls of the insulating structure 110, the inner sidewalls of the dielectric structure 102 and the insulating structure 110, and over an exposed portion of the conductive structure 104. The diffusion barrier layer 114 may be or otherwise comprise, for example, tantalum, titanium, titanium nitride, tantalum nitride, some other suitable metal(s), or some other suitable conductive material(s). The diffusion barrier layer 114 may be formed by, for example, chemical vapor deposition, physical vapor deposition, sputtering, or some other suitable formation process.

Figure 13:
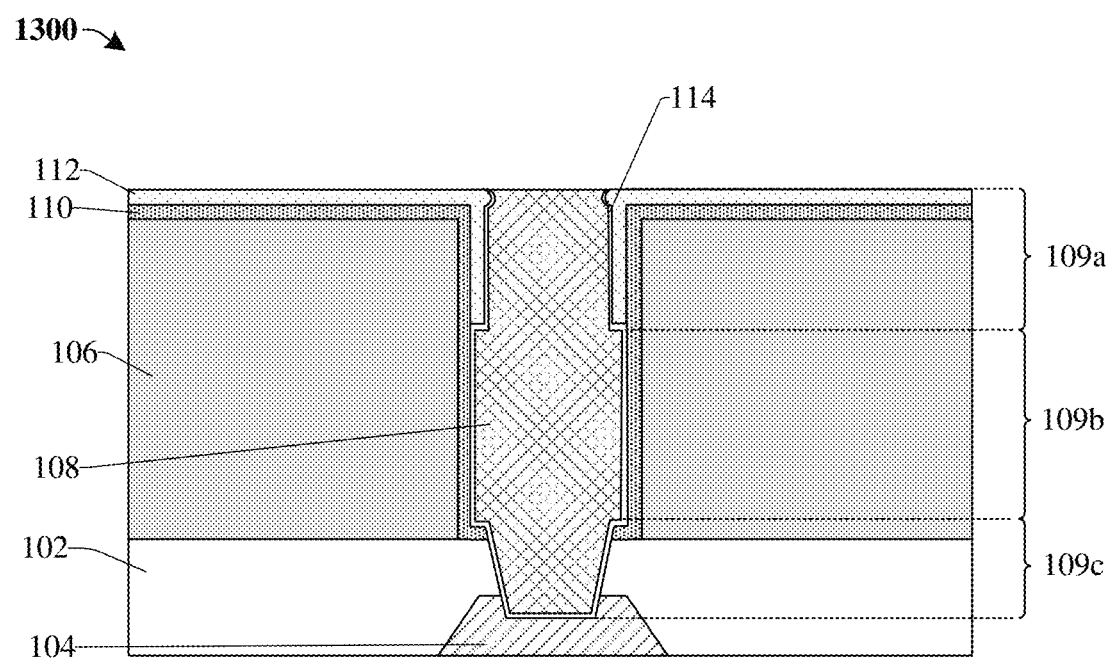

As illustrated by the cross-sectional view 1300 of FIG. 13, a TSV 108 is formed within the first hole 602 and the second hole 1002 by a formation process. The TSV 108 is thinned down to a top surface of the blocking layer 112 by a thin down process. The thin down process may be or otherwise comprise, for example, a chemical-mechanical planarization (CMP), grinding, an etch, or some other suitable thin down process. In some embodiments, the TSV 108 is laterally separated from the insulating structure 110, the blocking layer 112, and the dielectric structure 102 by the diffusion barrier layer 114. The TSV 108 may be formed by, for example, chemical vapor deposition, physical vapor deposition, sputtering, and/or a plating process (e.g., an electro-plating process, an electro-less plating process).

Figure 14:
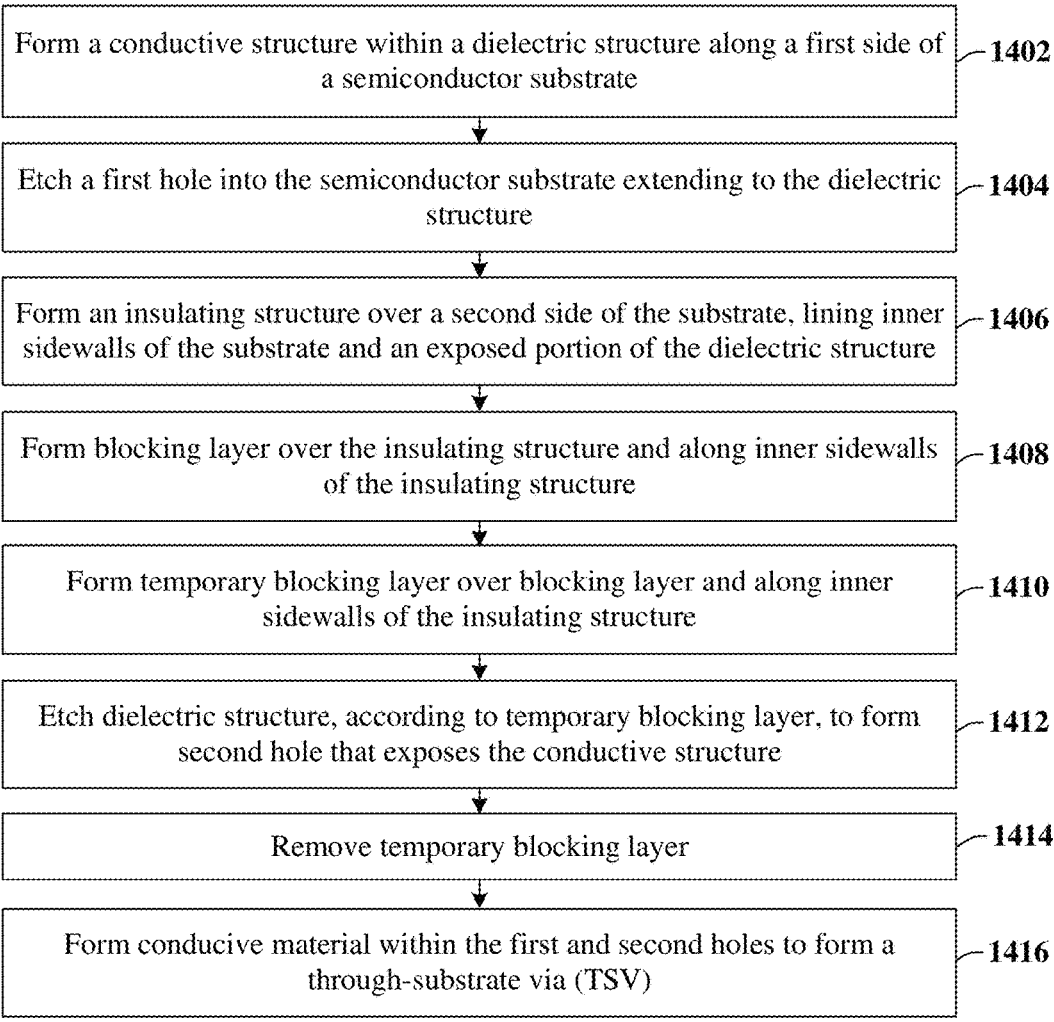
FIG. 14 illustrates a flowchart of some embodiments of a method consistent with FIGS. 5-13.

With respect to FIG. 14, a flowchart 1400 of some embodiments of a method for forming an IC comprising a TSV structure.

While the disclosed flowchart 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a conductive structure is formed within a dielectric structure along a first side of a semiconductor substrate. FIG. 5 illustrates a cross-sectional view 500 of some embodiments corresponding to act 1402.

At act 1404, a first hole is etched into the semiconductor substrate extending to the dielectric structure. FIG. 6 illustrates a cross-sectional view 600 of some embodiments corresponding to act 1404.

At act 1406, an insulating structure is formed over a second side of the substrate, lining inner sidewalls of the substrate and an exposed portion of the dielectric structure. FIG. 7 illustrates a cross-sectional view 700 of some embodiments corresponding to act 1406.

At act 1408, a blocking layer is formed over the insulating structure and along inner sidewalls of the insulating structure. FIG. 8 illustrates a cross-sectional view 800 of some embodiments corresponding to act 1408.

At act 1410, a temporary blocking layer is formed over the blocking layer and along inner sidewalls of the insulating structure. FIG. 9 illustrates a cross-sectional view 900 of some embodiments corresponding to act 1410.

At act 1412, a second hole is etched into the dielectric structure according to the blocking layer and the temporary blocking layer. The second hole extends from a top surface of the dielectric structure to the conductive structure. FIG. 10 illustrates a cross-sectional view 1000 of some embodiments corresponding to act 1412.

At act 1414, the temporary blocking layer is removed. FIG. 11 illustrates a cross-sectional view 1100 of some embodiments corresponding to act 1414.

At act 1416, a through-substrate via (TSV) is formed within the first and second trenches such that is electrically coupled to the conductive structure. FIGS. 12-13 illustrate cross-sectional views 1200-1300 of some embodiments corresponding to act 1416.

Accordingly, in some embodiments, the present disclosure relates to an integrated chip (IC) including a conductive structure disposed within a dielectric structure along a first side of a semiconductor substrate, an insulating structure disposed along inner sidewalls of the semiconductor substrate, the inner sidewalls of the semiconductor substrate extending through the semiconductor substrate, a blocking layer disposed along inner sidewalls of the insulating structure, and a through-substrate via (TSV) comprising a first portion and a second portion, the first portion extending from a second side of the semiconductor substrate to a horizontally-extending surface of the insulating structure that protrudes outward from the inner sidewalls of the insulating structure, the second portion extending from the first portion to the conductive structure and has a maximum width less than that of the first portion.

In other embodiments, the present disclosure relates to a method for forming an integrated circuit (IC), including forming a conductive structure within a dielectric structure along a first side of a semiconductor substrate, performing a first etching process on a second side of the semiconductor substrate to form sidewalls of the semiconductor substrate that define a first hole extending to the dielectric structure, forming an insulating structure over the second side of the semiconductor substrate and along the sidewalls of the semiconductor substrate, performing a second etching process on the dielectric structure to form sidewalls of the dielectric structure that define a second hole that extends to the conductive structure, the second hole having a maximum width less than that of the first hole, and forming a through-substrate via (TSV) within the first hole and the second hole.

In yet other embodiments, the present disclosure relates to a method of forming an integrated chip (IC) including forming a conductive structure within a dielectric structure along a first side of a semiconductor substrate, performing a first etching process on a second side of the semiconductor substrate to form sidewalls of the semiconductor substrate that define a first hole extending to the dielectric structure, forming an insulating structure over the second side of the semiconductor substrate and along the sidewalls of the semiconductor substrate, forming a blocking layer along the sidewalls of the dielectric layer, forming a temporary blocking layer along sidewalls of the blocking layer and along sidewalls of the insulating structure, performing a second etching process on the dielectric structure to form sidewalls of the dielectric structure that define a second hole that extends to the conductive structure, and forming a conductive material within the first hole and the second hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a conductive structure disposed within a dielectric structure along a first side of a semiconductor substrate;
an insulating structure disposed along inner sidewalls of the semiconductor substrate, wherein the inner sidewalls of the semiconductor substrate extend through the semiconductor substrate;
a blocking layer disposed along inner sidewalls of the insulating structure, wherein a bottommost surface of the blocking layer is above a bottommost surface of the insulating structure and above a bottommost surface of the semiconductor substrate; and
a through-substrate via (TSV) comprising a first portion and a second portion, wherein the first portion extends along a horizontally-extending surface of the insulating structure that protrudes outward from the inner sidewalls of the insulating structure, and wherein the second portion extends from the first portion to the conductive structure and has a maximum width less than that of the first portion.

2. The IC of claim 1, wherein the dielectric structure comprises inner sidewalls that are angled at a first angle with respect to the first side of the semiconductor substrate.

3. The IC of claim 1, wherein the first portion of the TSV directly overlies the horizontally-extending surface of the insulating structure.

4. The IC of claim 1, wherein the blocking layer has the bottommost surface that is vertically separated from the horizontally-extending surface of the insulating structure by the first portion of the TSV.

5. The IC of claim 1, wherein the horizontally-extending surface of the insulating structure has a width between approximately 70 nm and approximately 90 nm.

6. The IC of claim 1,
wherein the TSV further comprises a third portion that is separated from the second portion by the first portion; and
wherein the third portion has a smaller maximum width than the first portion.

7. The IC of claim 6, wherein the bottommost surface of the blocking layer is directly above an upper surface of the TSV.

8. The IC of claim 1, wherein the first portion of the TSV has sidewalls that are angled at a first angle with respect to the first side of the semiconductor substrate and the second portion of the TSV comprises sidewalls that are angled at a second angle with respect to the first side of the semiconductor substrate, the first angle different than the second angle.

9. The IC of claim 1, wherein the blocking layer has a smaller height than the insulating structure.

10. An integrated chip (IC), comprising:
a conductive structure disposed within a dielectric structure along a first side of a semiconductor substrate;
an insulating layer disposed along sidewalls of the semiconductor substrate that extend through the semiconductor substrate;
a through-substrate via (TSV) arranged between inner sidewalls of the insulating layer, wherein the TSV extends from the conductive structure to a second side of the semiconductor substrate; and
wherein the TSV has an outermost sidewall that flares outward towards a horizontally extending surface of the TSV, so that a maximum width of the TSV is along the horizontally extending surface of the TSV and is between the inner sidewalls of the insulating layer.

11. The IC of claim 10, wherein the insulating layer comprises horizontally extending surfaces that protrude outward from the inner sidewalls of the insulating layer, the TSV extending along the inner sidewalls and the horizontally extending surfaces of the insulating layer.

12. The IC of claim 10, wherein the insulating layer is directly between the horizontally extending surface of the TSV and the dielectric structure.

13. The IC of claim 10, wherein the TSV comprises a central segment between a top segment and a bottom segment, the bottom segment between being between the central segment and the conductive structure and the central segment having a greater width than the top segment and the bottom segment.

14. The IC of claim 10, wherein the insulating layer comprises second inner sidewalls, the second inner sidewalls being separated by a first distance that is smaller than a second distance separating the inner sidewalls of the insulating layer.

15. The IC of claim 10, wherein the horizontally extending surface of the TSV is coupled between the outermost sidewall of the TSV and an angled sidewall of the TSV, the angled sidewall being oriented at an obtuse angle measured with respect to the horizontally extending surface of the TSV.

16. The IC of claim 10, further comprising:
a blocking layer disposed along the inner sidewalls of the insulating layer, wherein the blocking layer comprises one or more protrusions extending outward from inner sidewalls of the blocking layer that face the TSV.

17. An integrated chip (IC), comprising:
a conductive structure disposed within a dielectric structure along a first side of a semiconductor substrate;
an insulating layer disposed along sidewalls of the semiconductor substrate, wherein the insulating layer comprises a horizontally extending surface that protrudes outward from an inner sidewall of the insulating layer; and
a through-substrate via (TSV) arranged between the inner sidewalls of the insulating layer and extending from the conductive structure to a second side of the semiconductor substrate, wherein the TSV comprises a horizontally extending surface contacting the horizontally extending surface of the insulating layer, the horizontally extending surface of the TSV being coupled between an outermost sidewall of the TSV and an angled sidewall of the TSV that is oriented at an obtuse angle measured with respect to the horizontally extending surface of the TSV; and wherein a bottommost surface of the TSV that faces the conductive structure is below a topmost surface of the conductive structure.

18. The IC of claim 17, further comprising:
a blocking layer disposed along the inner sidewall of the insulating layer, wherein the blocking layer has a first thickness measured along an imaginary line extending along a top of the insulating layer and a second thickness measured along a bottom surface of the blocking layer that faces the conductive structure, the first thickness being larger than the second thickness.

19. The IC of claim 17, wherein the outermost sidewall of the TSV flares outward as a distance from the horizontally extending surface of the TSV decreases.

20. The IC of claim 17,
wherein the TSV comprises a central segment between a top segment and a bottom segment, the bottom segment being between the central segment and the conductive structure; and
wherein the central segment has lower outer corners defined by first surfaces oriented at an acute angle and the bottom segment has lower outer corners defined by second surfaces oriented at an obtuse angle.

\* \* \* \* \*